United States Patent [19]
Lee

[11] Patent Number: 6,082,295
[45] Date of Patent: Jul. 4, 2000

[54] PLASMA ETCHING CHAMBER FOR MANUFACTURING SEMICONDUCTOR DEVICES

[75] Inventor: Sang-yeoul Lee, Kyungki-do, Rep. of Korea

[73] Assignee: Samsung Electronics Co., Ltd., Suwon, Rep. of Korea

[21] Appl. No.: 09/185,092

[22] Filed: Nov. 3, 1998

[30] Foreign Application Priority Data

Dec. 22, 1997 [KR] Rep. of Korea ...................... 97-71740

[51] Int. Cl.⁷ .................................................. C23C 16/00
[52] U.S. Cl. ............... 118/723 R; 156/345; 204/298.16; 204/298.17
[58] Field of Search .................................... 310/256, 192; 242/439.1; 118/715, 722, 723 R, 723 MR, 723 A, 620, 621, 623, 640; 204/298.16, 298.37; 156/345

[56] References Cited

U.S. PATENT DOCUMENTS

| | | | |
|---|---|---|---|
| 3,886,387 | 5/1975 | Graham et al. .......................... | 310/256 |
| 3,994,320 | 11/1976 | Dorsey et al. ........................... | 140/124 |
| 4,952,273 | 8/1990 | Popov ...................................... | 156/643 |
| 5,435,900 | 7/1995 | Gorokhovsky ...................... | 204/298.41 |
| 5,742,052 | 4/1998 | Noguchi et al. ...................... | 250/338.1 |

*Primary Examiner*—Deborah Jones
*Assistant Examiner*—L. Miranda
*Attorney, Agent, or Firm*—Jones Volentine, L.L.P.

[57] ABSTRACT

A plasma etching apparatus used in the semiconductor device fabrication process improves the uniformity of the etch process by ensuring the uniformity of a plasma gas. The apparatus includes magnetic coils surrounding an outer wall of an etching chamber for generating a magnetic field within the chamber to guide a plasma etch gas created by radio frequency (RF) energy. A power cable is connected to the magnetic coils for supplying power. A bracket, made of an insulating material, is attached at one side to the outer wall of the etching chamber and at an opposing side to the power cable.

3 Claims, 2 Drawing Sheets

PLASMA ETCHING CHAMBER FOR MANUFACTURING SEMICONDUCTOR DEVICES

BACKGROUND OF THE INVENTION

1. Field of the Invention

The present invention relates to a plasma etching chamber for manufacturing semiconductor devices, and more particularly, to a plasma etching chamber wherein the plasma gas formed by the radio frequency (RF) energy is made uniform by stabilizing the magnetic field for guiding the plasma gas, thereby preventing the plasma from converging at any one portion in the chamber.

2. Description of the Related Art

A plasma etching process is a type of dry etch process performed during a semiconductor device fabrication process. A plasma etcher works by creating a high-energy plasma in highly reactive gases. These ionized molecules react on the wafer surfaces with the appropriate films in a controlled and predictable fashion.

A typical plasma etch process is carried out as follows. First, wafers to be etched are transferred to an etching chamber, the process chamber is evacuated to create a vacuum state therein, and then specific process gases are supplied to the etching chamber. Next, RF energy is applied to the etching chamber to thereby create the high energy plasma from the ionized molecules of the specific process gases. Finally, these ionized molecules react with the wafer surface to etch the surface thereof.

In order to provide a more uniform plasma to improve the etching uniformity, a magnetic field is formed inside the etching chamber for guiding the plasma gases to the wafer surface.

FIG. 1 shows a conventional plasma etching chamber. A plurality of magnet coils 12 are disposed on the outer wall of the etching chamber 10, and power is supplied to the magnet coils 12 via a power cable 14. A magnetic field M is formed inside the etching chamber 10 by the power applied to the magnet coil 12, with the magnetic field M being induced according to the electrical polarities of the elements constituting the process gas in the plasma state. As described above, the plasma gas is directed toward a wafer surface where it reacts with the material on the wafer surface to perform the etch process.

The power cable 14 is connected to a bracket 16 which is in turn attached to the etching chamber 10. A connection nut 18 is inserted at the coupling location between the bracket 16 and the power cable 14 so as to support and fix the power cable 14 to the bracket 16.

However, the conventional dry etch facility constructed as above causes "convergence" of the plasma within the etching chamber around the connection site between the bracket 16 and the chamber 10. The connection site (not shown) is referred to as the EPD (End Point Detection) window. The convergence is caused by a partial discharge around the bracket 16 where the power cable 14 is connected. The conventional bracket 16 is made of a conductive material, aluminum, which is hard anodized by an electrolysis process. The magnetic field M inside the etching chamber 10 is affected by this partial discharge, as indicated by the spike "S" as shown by the arrow in FIG. 1. This spike S results in a concentration of the plasma in a direction confronting the connection site. As a result, the distribution of the plasma gas becomes unbalanced, and the portion of the wafer where the plasma gas is concentrated is over-etched.

Moreover, the connection nut 18 does not adequately support the power cable 14 where it is connected to the bracket 16. Indeed, the power cable 14 sometimes becomes detached due to vertically applied stress and friction. The detachment of the power cable shuts down the etching apparatus and thus decreases the operational efficiency.

SUMMARY OF THE INVENTION

The present invention is directed to a plasma etching chamber used in a semiconductor device fabrication process that improves the uniformity of the etch process by preventing an electrical discharge in the etching chamber, and thereby preventing a plasma gas from converging along a portion of the etching chamber.

Another object of the present invention is to provide an improved connection mechanism between a power cable, which supplies power to a magnet coil for the etching chamber, and a bracket attached to the etching chamber for fixing the power cable. This improved connection prevents the power cable from detaching from the bracket to thereby preclude any downtime for the etching chamber.

To achieve these and other advantages the present invention provides a plasma etching chamber for manufacturing semiconductor devices, the etching chamber having magnetic coils surrounding its outer wall for generating a magnetic field to guide a plasma etch gas in the etching chamber that was created by radio frequency (RF) energy. A power cable is connected to the magnetic coil for supplying power thereto. A bracket comprised of an insulating material is attached to the outer wall of the chamber, and the power cable is connected to the bracket. Preferably, an extended nut is also provided at the connection point between the power cable and the bracket to prevent the power cable from tilting. The bracket is made of an insulating plastic selected from the group consisting of polyamide, polyacetal, polycarbonate, polyester, or modified polyphenylene oxide.

It is to be understood that both the foregoing general description and the following detailed description are exemplary and explanatory and are intended to provide further explanation of the invention as claimed.

DETAILED DESCRIPTION OF THE PREFERRED EMBODIMENTS

The present invention now will be described with reference to the accompanying drawings in which a preferred embodiment of the invention is shown.

According to the present invention, an electrical discharge is prevented at the connection point between a power cable and a mounting bracket attached to the etching chamber. This is achieved by making the bracket from an insulating plastic, thereby preventing the plasma gas inside the etching chamber from converging at any one location.

Figure 1:
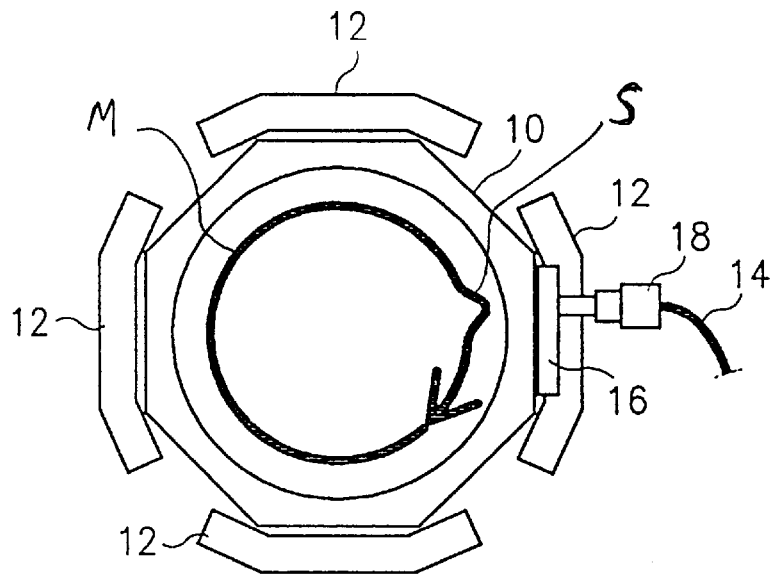
FIG. 1 is a schematic side view of the conventional plasma etching chamber for manufacturing semiconductor devices.
Figure 2:
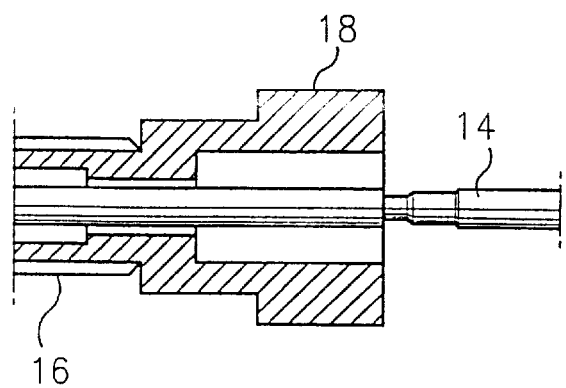
FIG. 2 is a sectional view of the conventional connection site between the power cable and the bracket.
Figure 3:
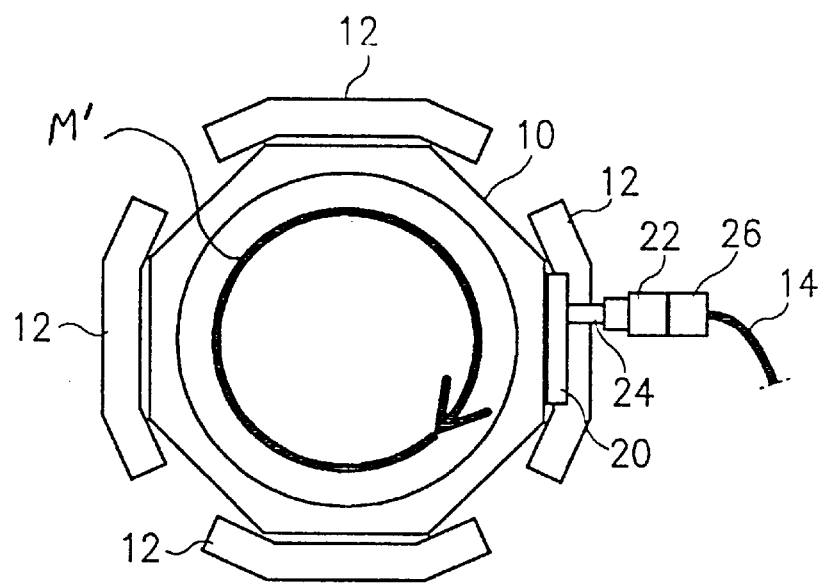
FIG. 3 is a schematic side view of a plasma etching chamber for manufacturing semiconductor devices according to one embodiment of the present invention.
Figure 4:
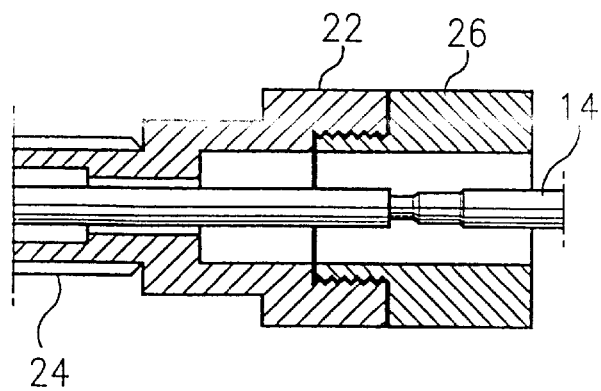
FIG. 4 is a sectional view of the connection site between the power cable and the bracket according to the present invention.

Referring to FIG. 3, a power cable 14 supplies power to the magnetic coils 12 installed around the outer wall of the etching chamber 10. Bracket 20, attached to the outer wall of the etching chamber 10, provides a connection between the power cable 14 and the etching chamber 10.

The bracket 20 is made of an insulating plastic, and is selected from a group including plastics such as polyamide, polyacetal, polycarbonate, polyester, or modified polyphenylene oxide. On the bracket 20, an extended coupling screw 24 is provided, and a connection nut 22 for supporting the end of the power cable 14 is coupled to the coupling screw 24.

Since the bracket 20 is made of an insulating material, there is no electrical discharge between the power cable 14 and the bracket 20. Accordingly, the magnetic field M' formed inside the etching chamber 10 is uniform as indicated in FIG. 3, since the bracket 20 does not exert any electrical influence on the etching chamber 10. In other words, a plasma within the etching chamber 10 would not converge toward any one direction since the magnetic field M' is uniform.

In addition, an extended nut 26 having a portion with outer threads communicates with an inner threaded portion of the connection nut 22 opposite from the etching chamber 10. The extended nut 26 has the effect of lengthening the connection nut 22 while supporting more of the length of the power cable 14, so that the power cable 14 has less of a tilt at the connection point. Therefore, any detachment of the power cable 14 attributable to vertical stress and friction between the power cable 14 and the bracket 20 is prevented in advance by strengthening the portion of the connection apparatus where detachment would likely occur.

Alternatively, in the absence of the extended nut 26, the connection nut 22 itself could be lengthened to provide the functions and advantages of the extended nut 26.

According to the present invention, the uniformity of the plasma within the etching chamber is improved, and convergence of the plasma along any one direction is substantially prevented.

In addition, detachment of the power cable from the bracket attached to the etching chamber is prevented as well by the extended nut or elongated connection nut, which minimizes the etching chamber downtime.

While the present invention has been described in detail, it should be understood that various changes, substitutions and alterations can be made hereto without departing from the spirit and scope of the invention as defined by the appended claims.

What is claimed is:

1. A plasma etching chamber for manufacturng semiconductor devices, comprising:

magnetic coils surrounding an outer wall of the etching chamber for generating a magnetic field within the etching chamber to guide a plasma etch gas created by radio frequency (RF) energy;

a power cable connected to the magnetic coil for supplying power thereto; and a bracket attached at one side to the outer wall of the etching chamber and at an opposing side to the power cable, wherein the bracket is made of an insulating, plastic material selected from the group consisting of polyamide, polyacetal, polycarbonate, polyester, and modified polyphenylene oxide.

2. The plasma etching chamber of claim 1, wherein the bracket comprises a coupling screw projecting in a direction away from said outer wall, and further comprising a connection nut fixed to the coupling screw, wherein the power cable is threaded through the connection nut and coupling screw.

3. The plasma etching chamber of claim 2, further comprising an elongated nut coupled to the connection nut, wherein the power cable is threaded through the elongated nut, the connection nut and coupling screw.

* * * * *